(12) United States Patent
Schilling

(10) Patent No.: US 6,403,904 B1
(45) Date of Patent: Jun. 11, 2002

(54) CONTACT SWITCH FOR AN ELECTRICAL APPLIANCE

(75) Inventor: Wilfried Schilling, Kraichtal (DE)

(73) Assignee: E.G.O. Elektro-Geratebau GmbH (DE)

( * ) Notice: Subject to any disclaimer, the term of this patent is extended or adjusted under 35 U.S.C. 154(b) by 0 days.

(21) Appl. No.: 09/506,994

(22) Filed: Feb. 18, 2000

(30) Foreign Application Priority Data

Feb. 19, 1999 (DE) .......................................... 199 07 226

(51) Int. Cl.⁷ ................................................ H01H 9/00
(52) U.S. Cl. ...................... 200/600; 200/310; 200/317; 341/33; 345/173; 345/176
(58) Field of Search ................................ 200/600, 512, 200/310–317; 338/99, 114, 118, 119, 160; 341/33; 345/173, 176; 362/29, 32, 84

(56) References Cited

U.S. PATENT DOCUMENTS

| | | | | |
|---|---|---|---|---|
| 4,855,550 A | * | 8/1989 | Schultz, Jr. ................. | 200/600 |
| 4,894,493 A | * | 1/1990 | Smith et al. ................. | 200/5 A |
| 5,491,314 A | * | 2/1996 | Dorsey ......................... | 200/313 |
| 5,572,205 A | * | 11/1996 | Caldwell et al. ............... | 341/33 |
| 5,721,666 A | * | 2/1998 | Girard ......................... | 361/627 |
| 5,917,165 A | * | 6/1999 | Platt et al. ................... | 200/600 |
| 5,973,417 A | | 10/1999 | Goetz et al. .................. | 307/129 |
| 6,016,134 A | * | 1/2000 | Ota ............................. | 345/104 |
| 6,137,072 A | * | 10/2000 | Martter et al. ............... | 200/512 |

FOREIGN PATENT DOCUMENTS

| | | | | |
|---|---|---|---|---|
| DE | 297 21 212 | 3/1998 | .......... | H03K/17/96 |
| DE | 297 21 213 | 3/1998 | .......... | H03K/17/16 |
| DE | 296 19 516 | 4/1998 | ............ | H05B/1/02 |
| DE | 197 06 168 | 8/1998 | .......... | H03K/17/96 |
| DE | 197 12 137 | 9/1998 | .......... | H03K/17/96 |
| DE | 198 02 479 | 7/1999 | ............ | G09G/3/04 |
| EP | 841 752 | 5/1998 | .......... | H03K/17/96 |

* cited by examiner

*Primary Examiner*—Michael Friedhofer
(74) *Attorney, Agent, or Firm*—Akerman Senterfitt

(57) ABSTRACT

A contact switch having a sensor element with a flat sensor surface, with which is associated an illuminated display in a housing. The sensor surface passes over the housing and has a cutout corresponding to the shape of the lighting means. The sensor surface surrounds the lighting means in a substantially non-overlapping manner and in particular additionally rests on the housing. The sensor surface can also be provided with an elastic, electrically conductive plate for improved adaptation to irregular covers.

20 Claims, 2 Drawing Sheets

CONTACT SWITCH FOR AN ELECTRICAL APPLIANCE

BACKGROUND OF THE INVENTION

The invention relates to a contact switch for an electrical appliance, which has a sensor element with a sensor surface made from flat material and is connected to a control for the sensor element and with it is associated an illuminated display with a housing and lighting means located therein.

Contact switches with rectangular, metallic sensor surfaces are known, e.g. conducting paths or surfaces on ceramic supports, which can be resiliently mounted. Such contact switches operate capacitively, which means that the approach or contact of a finger gives rise to a capacitor change on the part of the sensor element, which can be detected. They can be pressed by means of metal springs or the like onto the underside of a cover, e.g. a glass ceramic plate of a cooking area. The arrangement of such resilient sensor elements, their adaptation to a cover and fitting problems make use difficult.

OBJECT OF THE INVENTION

The problem of the invention is to provide a contact switch, which overcomes the disadvantages of the prior art and in which it is in particular improved with respect to effectiveness and the multiplicity of uses.

SUMMARY OF THE INVENTION

According to the invention the sensor surface passes over the housing and has a cutout corresponding to the shape of the lighting means and essentially in overlap-free manner surrounds said lighting means. This makes it possible to place the sensor surface so-to-speak between the illuminated display and the actuating surface or the location of an actuation, without shielding the illuminated display.

The contact switch or sensor element can be fitted below a substantially closed cover and a translucent cover is considered to be particularly suitable in order to render the lighting means visible. One possibility is a glass ceramic plate of an electrical cooking area. Advantageously the sensor element with the sensor surface engages on the underside of the cover and is in particular pressed directly onto it with a certain force. Actuation of the contact switch takes place by means of the capacitive coupling of a finger to the sensor element through the cover, so that it is very advantageous if the distance between the top of the cover and the sensor surface is substantially always identical. This can be achieved by a pressing action.

Preferably the sensor element is substantially metallic and can e.g. comprise a thin metal sheet. In particular, the sensor surface is planar. One possibility for the production of the above-described sensor element is to work or punch it completely and in a single process from a surface, particularly a metal plate. It can in particular have a portion with which it is conductively and/or in fastening manner connected to a base plate, particularly a printed circuit board or the like. The portion is advantageously constructed as a plug-in or standing leg and can be worked from the sensor element material by bending round. According to a variant a standing leg can have a rigid construction. According to a particularly preferred variant, especially in the case of one-piece manufacture, the standing legs do not extend over the outer boundaries of the surface area of the sensor element and prior to bending round preferably run in an inner face of the sensor element.

The sensor element can substantially frame the lighting means, preferably as a closed frame. As a function of the type of illuminated display or the intended actuation of the contact switch, the frame can have a width of between 1 to 5 mm and the width in particular varies between these values.

According to a preferred embodiment the sensor element is at least partly in engagement with the housing of the illuminated display, particularly on the top of the housing facing an actuating means or cover. This is particularly advantageous in illuminated displays with a housing, in which the lighting means maintain a clear spacing from the edge towards the inside. This spacing can be utilized as a bearing surface for the sensor element. The bearing action in particular permits a mechanical stabilization of the sensor element, without this loading capacity having to be provided by its own standing legs.

According to a particularly preferred development of the invention the sensor surface can have an at least partly flexible, electrically conductive coating.

A cover for the contact switch, in the case of a glass ceramic plate in particular, can have on its underside an irregular surface, particularly a standard stud arrangement. Thus metal plates rest on the tips of the highest irregularities. This leads to a disturbing air gap and the distance between the actuating surface and the sensor surface is not constant in the case of manufacture. However, a flexible, adaptable coating is ideally applied to the non-planar underside of a cover and thus avoids the aforementioned problems. Preferably plastic or rubber materials are used, which are made electrically conductive by admixing carbon, carbon black, metal, etc. Advantageously silicones are used in areas where high temperatures are encountered. As a function of the intended use and standard unevenness, the coating thickness can vary and it is advantageous to adopt a thickness between 0.1 and 2 mm, particularly of approximately 0.8 mm. The flexible material can have a Shore hardness range between 5 and 20, particular preference being given to approximately 10 to 15 Shore.

One possibility consists of constructing the coating as a contact plate of electrically conductive, flexible expanded or foamed material. It can in particular be worked or punched from a large-area web material and is advantageously subsequently applied to the sensor surface. The application or fastening is intended to form an electrically conductive transition and this can e.g. be achieved by means of a conductive adhesive or a corresponding adhesive tape. One possibility consists of providing the contact plates in the manner of stick-on labels on large-area webs or long rolls with a slightly adhering cover film for the adhesive coating. It is always possible to remove a contact plate from said reservoir and adhere it to a sensor surface. For this purpose mechanical and automatic processes are also known and preferably used.

The coating is preferably intended to provide an electrically conductive binding to the underside of a cover, so that it is made electrically conductive. The electrical resistance of the coating from surface to surface can be within a range of a few kiloohms to 15 kiloohm and preferably with an approximately 0.8 mm thick contact plate is approximately 7 kiloohms. For the resistance it must be borne in mind that the pressure exerted during operation on the coating must be taken into account.

As lighting means preference is given to those with a substantially parallelepipedic housing with a planar top surface on or below which are located the lighting means or through which the latter emit. The lighting means are advantageously light emitting diodes. In a preferred embodiment the illuminated display is a digital display, particularly a seven-segment display, the segments preferably being formed by light emitting diodes. Another possibility is provided by LCD's, which as a result of their lower light emission should be placed under a very transparent or translucent cover. When using background illuminated LCD's, dark covers are also possible.

To the sensor element can be connected switching means, e.g. relays, supplied following an actuation of the sensor surface with a signal produced at the sensor element in a converted form and switch an electric power. In this way working only takes place at the sensor element with signal levels, whereas higher power levels can be separately switched with conventional switches and electrical contacts or the like.

These and further features can be gathered from the claims, description and drawings and the individual features, either singly or in the form of subcombinations, can be implemented in an embodiment of the invention and in other fields and can represent advantageous, independently protectable constructions for which protection is claimed here. The subdivision of the application into individual sections and the subtitles in no way limit the general validity of the statements made thereunder.

BRIEF DESCRIPTION OF THE DRAWINGS

An embodiment of the invention is described in greater detail hereinafter relative to the attached drawings, wherein show.

DETAILED DESCRIPTION OF THE EMBODIMENT

Figure 1:
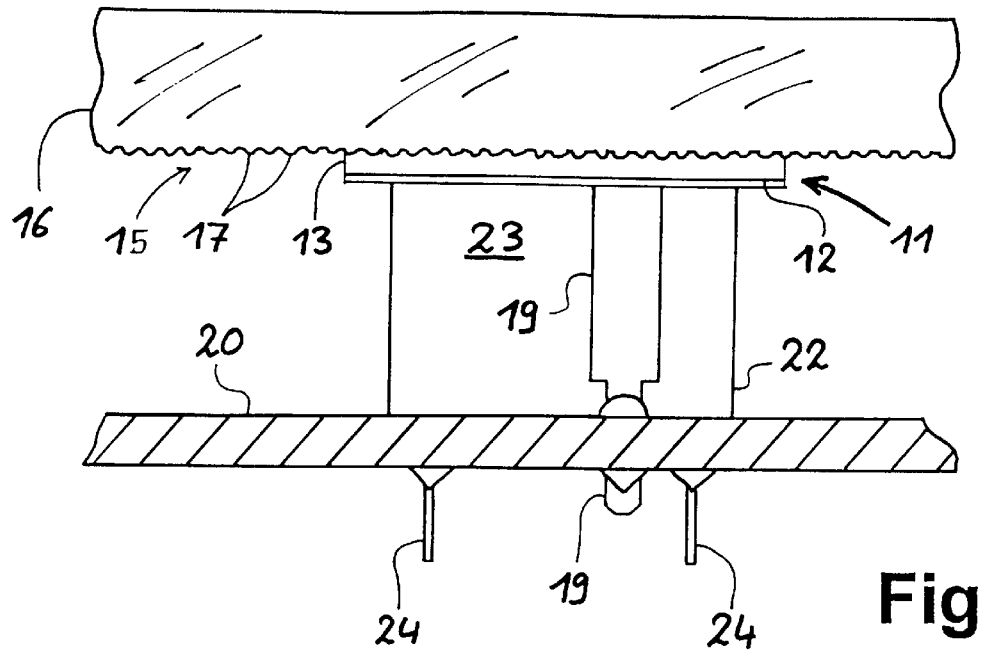
FIG. 1 A side view of a sensor element resting on the housing of a display and which is pressed by a flexible contact plate against the underside of a cover.

FIG. 1 shows in side view a sensor element 11 having a sensor surface 12, which carries a flexible contact plate 13 in the form of a coating. By means of the elastic contact plate 13 the sensor element 11 is pressed against the underside 15 of a glass ceramic plate 16. The underside 15 has more or less regular studs 17, which can be easily pressed into the contact plate, which can consequently engage flat and substantially without any air gap with the underside 15. In FIG. 1 the thickness of the contact plate 13 has been chosen in such a way that the penetration depth of the studs 17 roughly corresponds to 20% of the thickness.

By means of two standing legs 19 passing from the sensor surface 12 and whereof only the front leg can be seen in FIG. 1, the sensor element 11 is soldered to a printed circuit board 20. Electric contacts and conducting paths are omitted to facilitate ease of understanding. Obviously the printed circuit board can carry these and also further electrical and/or electronic components.

Under the sensor element 11 is placed the housing 22 of a seven-segment display 23 and soldered with soldering pins 24 to the printed circuit board 20. As can be seen, the sensor element 11 or sensor surface 12 rests on the seven-segment display 23 and is consequently supported by the latter. Due to the robust construction of housings of such seven-segment displays 23, the arrangement according to FIG. I can advantageously take over the function of spacers between a printed circuit board 20 and a cover 16. The essential function of the standing legs 19 is the electrical contacting, as well as to press the sensor element 11 downwards against the display 23.

Figure 2:
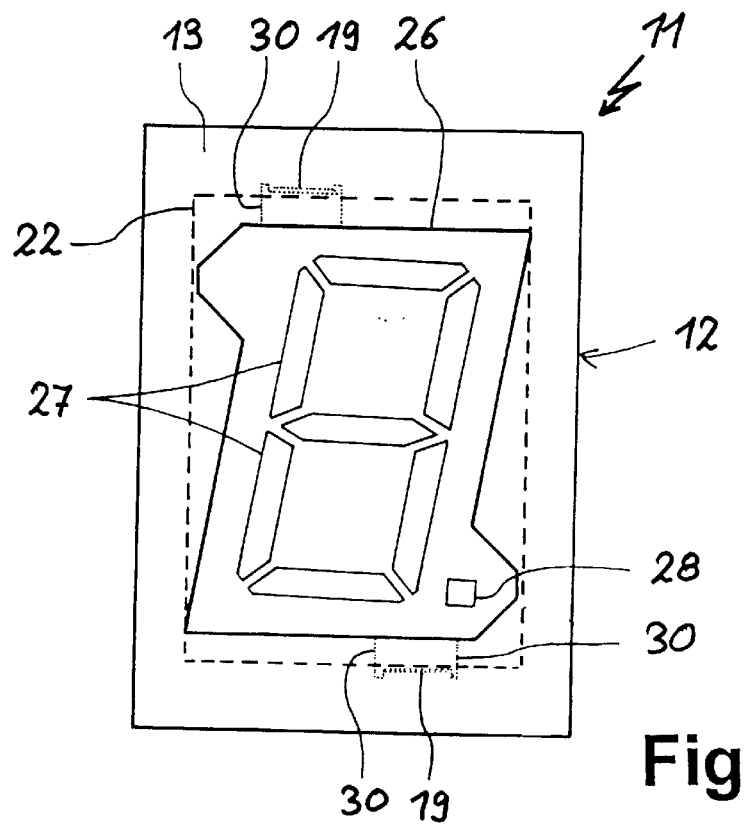
FIG. 2 A plan view of the arrangement of FIG. 1 showing that the sensor element together with the coating frames the digital display and is correspondingly cutout.

The plan view of FIG. 2 shows the frame-like construction of the sensor element 11 with the cutout 26, which is constructed substantially congruently both in the contact plates 13 and in the sensor surface 12. The special construction of the cutout 26 shown in FIG. 2 simulates the outer path of segment bars 27, as well as the luminous spot 28 of the display 23. The sensor surface 12 rests throughout on the housing 22 of the display 23 represented in broken line form. It also projects over its sides by a limited amount in each case with the external dimensions of a rectangle. Notches 30 in the sensor surface 12 are shown in dotted line form and at which the standing legs 9 are bent into the drawing plane. The cutout can be individually adapted to the arrangement of the segment bars.

Figure 3:
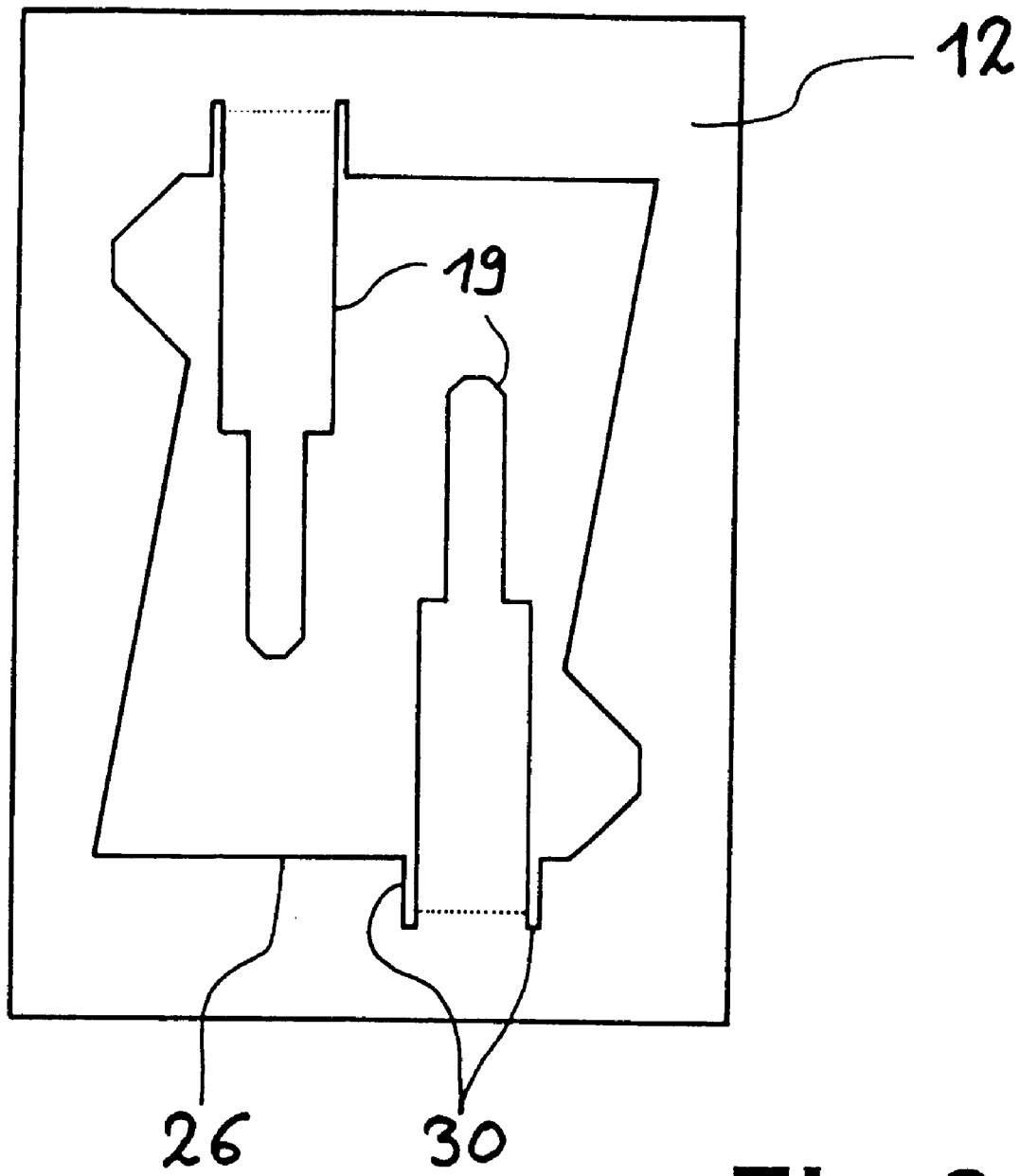
FIG. 3 A plan view of a sensor element after punching out of a metal plate.

FIG. 3 shows a plan view of a sensor surface 12 from which are punched or worked the cutout 26 and the notches 30. It is possible to see the advantageous arrangement of the not bent round standing legs 19 within the cutout 26, so that it is possible to reduce the material surface required for producing a sensor surface 12. The diametrically facing standing legs 19 offer a good and adequate fastening of the sensor element 11 in the downwards direction against the housing 22 of the display 23. It can be seen that the standing legs 19 just move past the housing 22 of the display 23. This can also be advantageous for a positioning of the sensor element 11 on insertion into the printed circuit board 20.

Following the punching process a contact plate 13, e.g. constructed in accordance with FIG. 2, can be bonded to the sensor surface 12 or the top of the sensor element 11 and only then are the standing legs 11 bent round along the dotted lines.

One of the main advantages of the invention is that of creating a contact-sensitive display. There is no need for the user to initiate sensor surfaces arranged separately from the display and which possibly firstly have to be sought or associated. An application of the finger on the clearly visible illuminated display or the cover above it is sufficient to initiate a switching process, e.g. as an on-off switch of a cooking area control. The size of conventional seven-segment displays 23 or the segment bars 27 contained makes it possible to achieve an adequate dimensioning of the actuating surface of the sensor element 11. One form of conventionally used displays of this type has a housing with dimensions of approximately 9.5 to 13 mm.

A further major advantage is in the flexible coating of the sensor element 11 permitting an adaptation to the underside of a studded glass ceramic plate 16, whose precision has been hitherto unachievable with metallic sensor surfaces 12. Further characteristics of the flexible material, such as its internal electrical and its inductive resistance as a result of the conductivity and volume, have advantageous effects on the evaluation of an actuation or can contribute to suppressing interference signals.

The sensor element can be controlled by numerous known methods or control systems. Particularly advantageous is a circuit arrangement described in DE 297 21 213.

What is claimed is:

1. A contact switch for an electrical appliance, said contact switch comprising:

a capacitive sensor element having a flat sensor surface;

control means for said sensor element;

an illuminated display having a housing and lighting means located therein; and an inflexible cover provided over said contact switch;

wherein said lighting means has a specific shape;

wherein said flat sensor surface is situated over said housing and has a cutout corresponding to said shape of said lighting means and surrounding said lighting means in a substantially overlap-free manner; and wherein said housing has a top and said sensor element at least partly engages said top of said housing.

2. The contact switch according to claim 1, wherein said cover is translucent.

3. The contact switch according to claim 2, wherein said cover is a glass ceramic plate of an electric cooking area.

4. The contact switch according to claim 2, wherein said cover has an underside, said sensor element contacts said underside of said cover with said sensor surface and is pressed thereto.

5. The contact switch according to claim 1, wherein said sensor element is essentially formed from sheet metal.

6. The contact switch according to claim 1, wherein said sensor element has at least one rigid standing leg portion.

7. The contact switch according to claim 6, wherein sensor surface has a base face, and said standing leg portion is punched from said base face.

8. The contact switch according to claim 1, wherein said sensor element is constructed so as to substantially frame said lighting means.

9. The contact switch according to claim 8, wherein said sensor element is an all-round frame with a width of 1 to 4 mm.

10. The contact switch according to claim 1, wherein the sensor element at least partly engages said top of said housing facing said cover.

11. The contact switch according to claim 1, wherein said sensor surface has an at least partly flexible, electrically conductive coating.

12. The contact switch according to claim 11, wherein said coating is a contact plate of electrically conductive foam.

13. The contact switch according to claim 12, wherein said contact plate is cut out of a web of material and is applied to said sensor surface.

14. The contact switch according to claim 11, wherein said coating has an electrical resistance ranging from 1 to 15 kiloohm when incurred from surface to surface.

15. The contact switch according to claim 11, wherein said flexible coating has a Shore hardness ranging from 5 to 20.

16. The contact switch according to claim 1, wherein said housing is substantially parallelepipedic with a planar top surface, said lighting means being located on said top surface.

17. The contact switch according to claim 1, wherein said display is a digital display having light emitting diodes.

18. The contact switch according to claim 1, wherein a switching signal is produced by action on said sensor surface, said sensor element being connected with switching means for switching an electric power in accordance with said switching signal.

19. A contact switch for an electrical appliance, comprising:

a sensor element with a flat sensor surface;

control means for said sensor element; and an illuminated display having a housing and lighting means located therein;

wherein said sensor surface is situated over said housing and has a cutout;

wherein said cutout corresponds to a shape of said lighting means and surrounds said lighting means in a substantially overlap-free manner; and wherein said sensor element has at least one rigid standing leg portion.

20. The contact switch according to claim 19, wherein said sensor surface has a base face, and said standing leg portion is punched from said base face.

* * * * *